(12) United States Patent
Kuramoto

(10) Patent No.: US 7,745,841 B2
(45) Date of Patent: Jun. 29, 2010

(54) SEMICONDUCTOR LIGHT-EMITTING DEVICE

(75) Inventor: Kyosuke Kuramoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/269,626

(22) Filed: Nov. 9, 2005

(65) Prior Publication Data

US 2006/0097242 A1 May 11, 2006

(30) Foreign Application Priority Data

Nov. 10, 2004 (JP) ............... 2004-325924
Oct. 26, 2005 (JP) ............... 2005-311027

(51) Int. Cl.
*H01L 31/0352* (2006.01)

(52) U.S. Cl. .................... 257/96; 257/E33.001

(58) Field of Classification Search ............ 257/94, 257/96, 103, E33.001; 372/43.01
See application file for complete search history.

(56) References Cited

U.S. PATENT DOCUMENTS

| 5,544,188 | A | 8/1996 | Takiguchi et al. |
| 6,563,850 | B1 | 5/2003 | Matsumoto et al. |
| 6,642,546 | B2 | 11/2003 | Kuramoto et al. |
| 2002/0053676 | A1 | 5/2002 | Kozaki |
| 2005/0127391 | A1 | 6/2005 | Yanamoto |

FOREIGN PATENT DOCUMENTS

| JP | 7-170022 | 7/1995 |
| JP | 10-294534 | 11/1998 |
| JP | 11-112087 | 4/1999 |
| JP | 11-274644 | 10/1999 |
| JP | 2002-223042 | 8/2002 |
| JP | 2002-335052 | 11/2002 |
| JP | 2003-204122 | 7/2003 |
| JP | 2003-273473 | 9/2003 |
| JP | 2004-087908 | 3/2004 |
| KR | 2001-0090499 | 10/2001 |
| KR | 2001-0114210 | 12/2001 |
| WO | WO 01/47035 | 6/2001 |

OTHER PUBLICATIONS

Van De Walle et al., *Small valence-band offsets at GaN/InGaN heterojunctions*, pp. 2577-2579 (1997), 1997 American Institute of Physics.

*Primary Examiner*—Lynne A Gurley
*Assistant Examiner*—Colleen A Matthews
(74) *Attorney, Agent, or Firm*—Leydig, Voit & Mayer, Ltd.

(57) ABSTRACT

A semiconductor light-emitting device which exhibits small threshold current, high differential efficiency, and good characteristics, by reducing electrons that overflow an electron barrier, trapping the electrons in an active layer. Of the barrier layers of an active layer, a final barrier layer, which is a barrier layer closest to a p side, is smaller in band gap energy than other barrier layers. Thus, as compared with a case where the final barrier layer has the same band gap energy as that of the other barrier layer, an energy band discontinuity (electron barrier) with an electron blocking layer can be made larger. As a result, overflow of electrons is reduced.

24 Claims, 4 Drawing Sheets

SEMICONDUCTOR LIGHT-EMITTING DEVICE

BACKGROUND OF THE INVENTION

1. Field of the Invention

The present invention relates to a semiconductor light-emitting device using a nitride-based III-V group compound semiconductor.

2. Description of the Background Art

Recently, as a semiconductor laser which enables light emission in a range from a blue region to an ultraviolet region, which is required for making the density of an optical disc high, a nitride-based semiconductor laser using a nitride-based III-V group compound semiconductor has been intensively researched and developed, and has been already put in use.

In the nitride-based semiconductor lasers reported so far, as an active layer structure, there has been frequently adopted a multiple quantum well structure with two or more well layers made of InGaN and three or more barrier layers made of InGaN having a smaller In composition ratio than that of the InGaN of the well layers (usually about 0.02) are laminated alternately.

In the nitride-based III-V group compound semiconductor, the ratio of the band discontinuity of the conduction band and the band discontinuity of the valence band when a hetero junction is formed is about 2.5:7.5, and it is known that the band discontinuity of the conduction band is very small (see Applied Physics Letter vol. 70 (1997), p. 2577. Accordingly, electrons are likely to overflow from the well layer beyond the barrier layer, which often leads to problems such as increase in threshold current, and deterioration of differential efficiency and temperature characteristic.

In order to solve these problems, it may be considered to increase the band discontinuity of the conduction band by widening the band gap of the barrier layer as much as possible. For this purpose, InGaN having smaller In composition ratio may be used as the barrier layer, or a material having larger band gap than that of InGaN may be used, such as GaN, AlGaN or InAlGaN.

When the band gap of the barrier layer is widened, the band discontinuity of the valence band is increased. However, as a barrier layer, when InGaN having the smallest In composition ratio is used or when GaN or AlGaN is used, these materials become smaller in lattice constant as they become wider in band gap, and are exposed to greater tensile distortion. According to the band properties of semiconductors receiving this distortion, the band discontinuity of the valence band is not increased so much as compared with the increase of the band discontinuity of the conduction band.

As a result, it is considered that the problem of overflow of electrons can be solved without causing a problem in uniform injection of holes in the wells of two layers or more.

The conventional art related to the present invention is disclosed in Japanese Patent Application Laid-Open No. 07-170022 (1995).

However, the present inventor has confirmed by simulation that a new problem arises when a barrier layer is made of a material having larger band gap, electrons are likely to overflow beyond the electron blocking layer from a final barrier layer which is closest to the p-side. It is considered that this problem is caused due to the following reason: the barrier layer is made of a material having a larger band gap, so that a band discontinuity (electron barrier) between the final barrier layer and the electron blocking layer becomes small.

Further, in the case of barrier layers of InGaN of smaller band gap than GaN or AlGaN, the rate of electrons overflowing the electron barrier from the final barrier layer is not zero, which may lead to deterioration of threshold current of a semiconductor light-emitting device, differential efficiency, and temperature characteristics.

Accordingly, omitting the final barrier layer, by bonding the well layer and electron blocking layer directly, may be considered to reduce the overflowing electrons by increasing the height of the electron barrier, instead of the presence of a final barrier layer.

However, the film forming temperature of an electron blocking layer is higher than that of a well layer by about 200° C. Therefore, if it is attempted to form an electron blocking layer directly on the well layer, after forming the well layer, the film forming temperature must be raised without protecting the surface of the well layer. In this process, crystallinity of the well layer surface deteriorates.

When a semiconductor light-emitting device is manufactured by using such a well layer deteriorated in crystallinity, electrons trapped in the well layer do not contribute to laser oscillation, and threshold current or differential efficiency may be worsened.

SUMMARY OF THE INVENTION

It is an object of the present invention to provide a semiconductor light-emitting device which exhibits small threshold current, high differential efficiency and good characteristics, by reducing electrons that overflow an electron barrier that is provided for trapping the electrons in an active layer.

According to a first aspect of the present invention, a semiconductor light-emitting device has a structure that an active layer interposed between an n-type clad layer and a p-type clad layer and uses a nitride-based III-V group compound semiconductor.

The active layer has a plurality of barrier layers, and well layers interposed between the barrier layers.

A final barrier layer close to the p-type clad layer side has a smaller band gap than that the barrier layers.

According to the present invention, the band gap of the final barrier layer is made smaller than the band gap of the barrier layers. Accordingly, an electron barrier formed between the barrier layers and the p-type clad layer is larger than a case where the barrier layers are used as a final barrier layer. As a result, electrons overflowing the electron barrier from the active layer can be reduced.

Besides, since the final barrier layer is formed on a well layer, it is free from deterioration in crystallinity.

According to the second aspect of the present invention, a semiconductor light-emitting device has a structure with an active layer interposed between an n-type clad layer and a p-type clad layer and uses a nitride-based III-V group compound semiconductor.

The active layer has a plurality of barrier layers, and well layers formed alternately to the barrier layers.

The semiconductor light-emitting device includes a first layer which is provided between the plurality of barrier layers and the p-type clad layer and has a band gap smaller than the bandgap energy of the plurality of barrier layers and larger than the bandgap energy of the well layers.

According to the present invention, the band gap of the first layer is smaller than the bandgap of the plurality of barrier layers. As a result, as compared with the electron barrier formed between the barrier layers and the p-type clad layer, the electron barrier between the first layer and the p-type clad layer can be larger; therefore, electrons overflowing the electron barrier from the active layer can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
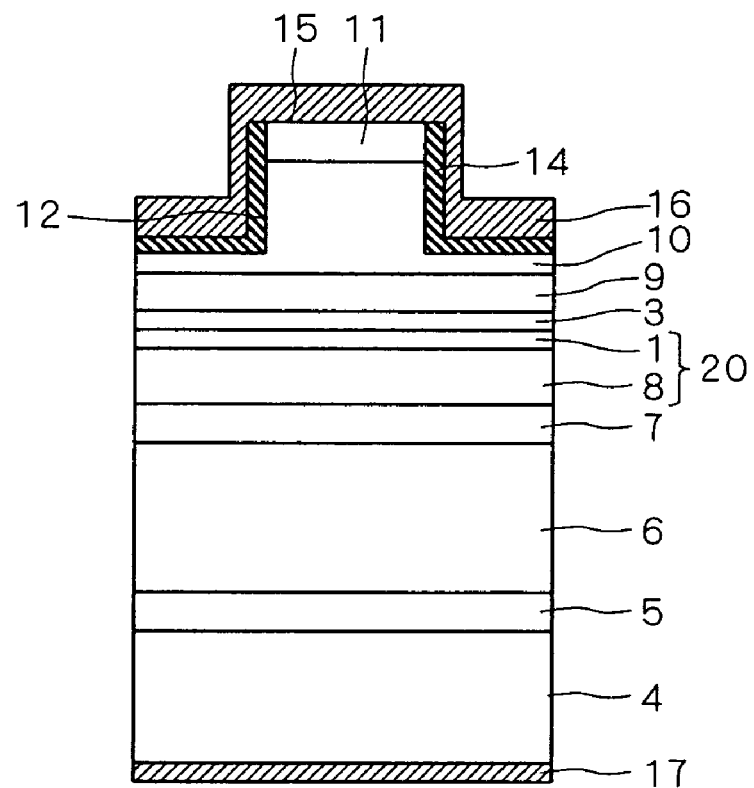
FIG. 1 is a sectional view showing a configuration of a nitride-based semiconductor laser according to a first embodiment.

FIG. 1 is a sectional view showing a configuration of a nitride-based semiconductor laser (semiconductor light-emitting device) according to a first embodiment. This nitride-based semiconductor laser has a ridge structure and an SCH structure.

As shown in FIG. 1, the nitride-based semiconductor laser according to this embodiment has an n-type GaN buffer layer 5 formed on a Ga surface which is a main surface of a GaN substrate 4. This layer is formed for the purpose of reducing surface undulations on the GaN substrate 4 and laminating the upper layers flatly as much as possible.

On the n-type GaN buffer layer 5, an n-type AlGaN clad layer (n-type clad layer) 6, an n-type GaN optical guide layer 7 as an n-side guide layer, an structure 20, a p-type AlGaN electron blocking layer 3 (electron blocking layer, blocking layer), a p-type GaN optical guide layer 9 as a p-side guide layer, a p-type AlGaN clad layer (p-type clad layer) 10, and a p-type GaN contact layer (p-type contact layer) 11 are laminated sequentially.

Herein, the p-type GaN optical guide layer 9 is selected so as to have a band gap larger than those of a final barrier layer 1 and a barrier layer 2 which will be described later. The p-type GaN optical guide layer 9 is provided in contact with the structure 20 side of the p-type clad layer 10.

The n-type GaN buffer layer 5 has a thickness of, for example, 1 μm, and silicon (Si) doped as n-type impurity. The n-type AlGaN clad layer 6 has a thickness of, for example, 1 μm, Si doped as n-type impurity, and an Al composition ratio of, for example, 0.07.

The structure 20 includes a plurality of barrier layers, and a plurality of well layers formed so as to be interposed between the plurality of barrier layers, and constitute a multiple quantum well structure. A barrier layer which is closest to the p-type clad layer 10 side corresponds to the final barrier layer 1.

Figure 2:
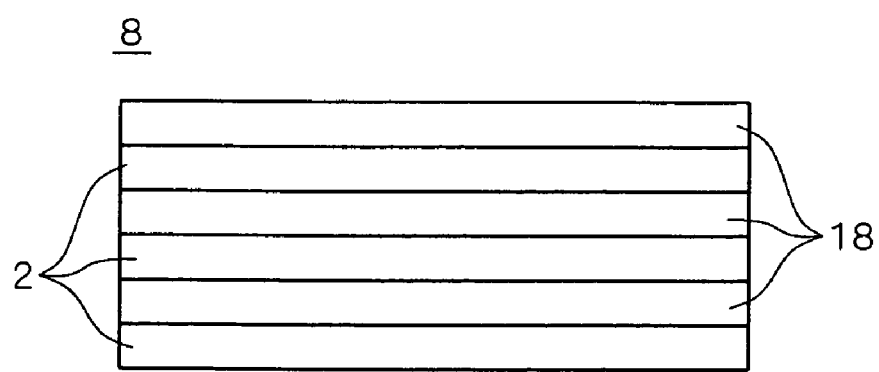
FIG. 2 is a sectional view showing a configuration of a partial active layer of the nitride-based semiconductor laser according to the first embodiment.

FIG. 2 is a sectional view of the active layer 8 of the structure 20. The active layer 8 has a configuration in that barrier layers 2 made of $In_xGa_{1-x}N$ (x=0.02) (barrier layers other than the final barrier layer 1), and well layers 18 made of $In_yGa_{1-y}N$ (y=0.14) are laminated alternately. The thickness of the barrier layers 2 is, for example, 7 nm, and the thickness of the well layers 18 is, for example, 3.5 nm.

The final barrier layer 1 is formed of undoped $In_zGa_{1-z}N$ having a thickness of 20 nm. The In composition ratio z is, for example, 0.04. The In composition ratio z of final barrier layer 1 is larger than the In composition ratio x (=0.02) of the barrier layers 2, and the band gap is smaller than the band gap of the barrier layers 2.

Hence, the In composition ratios x, y, z satisfy the relation of $0<x<z<y<1$. Also the In composition ratios x, y, z satisfy the relation of $(y-z)>(z-x)$.

The final barrier layer 1 is selected to be different in thickness and larger in thickness of the barrier layers 2 and the well layers 18.

In this example of this embodiment, the number of well layers of the structure 20 is three.

The p-type AlGaN electron blocking layer 3 has a thickness of, for example, 10 nm, and an In composition ratio of, for example, 0.18. The p-type GaN optical guide layer 9 has a thickness of, for example, 100 nm. The p-type AlGaN clad layer 10 has a thickness of, for example, 400 nm, Mg doped as p-type impurity, and an Al composition ratio of, for example, 0.07. The p-type GaN contact layer 11 has a thickness of, for example, 100 nm, and Mg doped as p-type impurity.

The ridge 12 is formed in the p-type AlGaN clad layer 10 and the p-type contact layer 11 by etching, for example, in a direction of (1-100). The ridge 12 has a width of, for example, 2.2 μm.

The ridge 12 is formed on the GaN substrate 4 at a position corresponding to a low defect region located between high dislocation regions of several microns to tens of microns in width formed in a stripe. To protect the surface or insulate electrically at the side or lateral bottom side of the ridge 12, an insulating film 14 such as an $SiO_2$ film having a thickness of, for example, 200 nm is formed so as to cover the ridge 12.

In the insulating film 14, the portion formed on the ridge 12 has an opening 15. By this opening 15, electrical contact between the p-type electrode 16 and the p-type contact layer 11 is established.

The p-type electrode 16 has a structure, for example, of Pd and Au films sequentially laminated. On the N surface at the opposite side of the Ga surface, that is, the main surface of the GaN substrate 4, an n-type electrode 17 is formed. The n-type electrode 17 has a structure that, for example, Ti and Au films are sequentially laminated.

Figure 3:
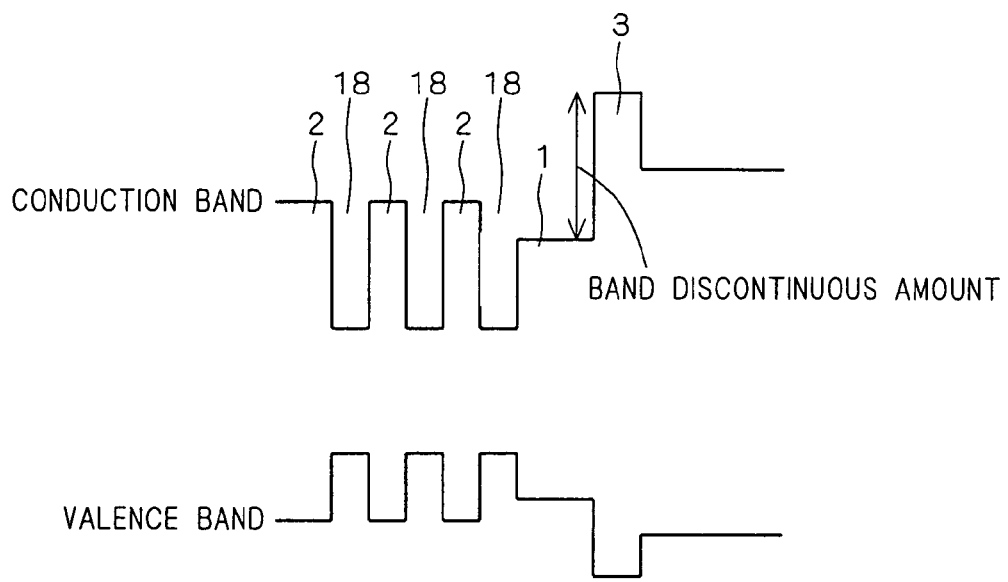
FIG. 3 is a band diagram of the nitride-based semiconductor laser according to the first embodiment.

FIG. 3 is a band diagram in the vicinity of the structure 20 of the nitride-based semiconductor laser according to this embodiment. The band diagram in FIG. 3 uses the same reference numerals as the structure, at the position corresponding to the composition of the nitride-based semiconductor laser according to this embodiment. It is clear from FIG. 3 that the band discontinuity between the final barrier layer 1 and the electron blocking layer 3 is larger than the band discontinuity between the barrier layer 2 and the electron blocking layer 3.

Figure 7:
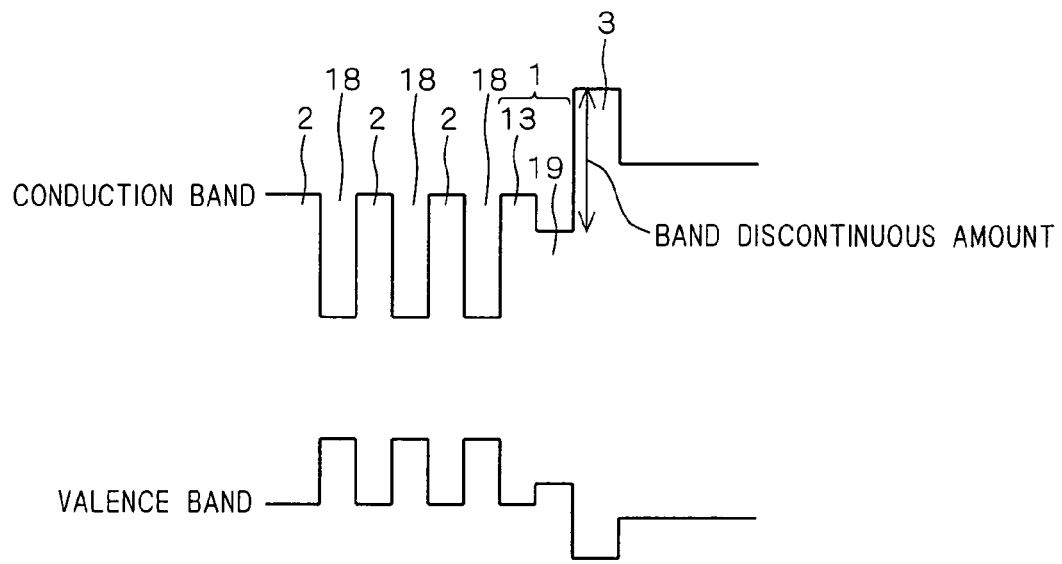
FIG. 7 is a band diagram of a nitride-based semiconductor laser according to a second embodiment.

In FIG. 3, the final barrier layer 1 and the barrier layers 2 are each located adjacent to and have larger band gaps than respective well layers 18. Of those two kinds of barrier layers, the final barrier layer 1 is closer to the p-type layers of the semiconductor laser, i.e., the p-side. In the first preferred embodiment, the final barrier layer 1 has a smaller band gap than the barrier layers 2. This final barrier layer 1 may be configured of a plurality of layers 13 and 19 having larger band gaps than the well layers 18, as shown in FIG. 7 which will be described later in a second preferred embodiment.

In FIG. 3, the final barrier layer 1, a layer which has a larger band gap than the well layer 18 closest to the p-side, is provided between and in contact with the well layer 18 closest to the p-side and the electron blocking layer 3. The band gap of this final barrier layer 1 is smaller than that of the barrier layers 2.

If there is no electron blocking layer 3 provided, a final barrier layer whose band gap is larger than that of the well layers 18 and smaller than that of the barrier layers 2 may be provided between the well layer 18 closest to the p-side and an optical waveguide layer. Or, if there is no electron blocking layer 3 and no optical waveguide layer provided, a final barrier layer whose band gap is larger than that of the well layers 18 and smaller than that of the barrier layers 2 may be provided between the well layer 18 closest to the p-side and a clad layer 10.

A manufacturing method of the semiconductor light-emitting device according to this embodiment is explained.

At first, the surface of the GaN substrate 4 is cleaned preliminarily by thermal cleaning or the like, and the n-type GaN buffer layer 5 is grown on the surface at a growth temperature of, for example, 1000° C. by metal organic chemical vapor deposition (MOCVD).

Thereafter, by the same MOCVD method, the n-type AlGaN clad layer 6, the n-type GaN optical guide layer 7, the active layer 8 having an undoped $In_xGa_{1-x}N/In_yGa_{1-y}N$ multiple quantum well structure, the final barrier layer 1 made of undoped InGaN, the p-type AlGaN electron blocking layer 3, the p-type GaN optical guide layer 9, the p-type AlGaN clad layer 10, and the p-type GaN clad layer 11 are laminated sequentially.

Herein, growth temperatures of these layers are, for example, 1000° C. for the n-type AlGaN clad layer 6 and the n-type GaN optical guide layer 7, 740° C. from the active layer 8 to the undoped InGaN final barrier layer 1, and 1000° C. from the p-type AlGaN electron blocking layer 3 to the p-type GaN contact layer 11.

Resist is applied on the whole surface of the wafer after finishing the crystal growth process, and a resist pattern (not shown) having a predetermined shape corresponding to the shape of the ridge 12 is formed by lithography. Using this resist pattern as a mask, the wafer is etched into the layer of the p-type AlGaN clad layer 10 by, for example, RIE (reactive ion etching). By this etching, the ridge 12 is manufactured as a optical waveguide structure. As the RIE etching gas, for example, chlorine is used.

Next, without removing the resist pattern used as mask, a $SiO_2$ film 14 having a thickness of, for example, 0.2 μm is formed on the entire surface of the substrate by CVD, vacuum deposition, or sputtering. Then, the resist pattern is removed, and the $SiO_2$ film on the ridge 12 is removed at the same time. After this lift-off, the opening 15 is formed on the ridge 12.

Next, on the entire surface of substrate, Pt and Au films are formed sequentially by, for example, vacuum deposition. In succession, after applying the resist, a resist pattern is formed for forming the p-type electrode 16 by lithography. Using the resist pattern as a mask, the p-type electrode 16 is formed by wet etching or dry etching.

Thereafter, on the front side of the reverse surface of substrate, Ti and Al films are formed sequentially by vacuum deposition. An alloy is formed for ohmic contact with the n-type electrode 17.

This substrate is processed into a bar shape by cleaving or the like, and both resonator ends are formed, and the resonator ends are coated, and the bar is formed into a chip by cleaving. Finally, the nitride-based semiconductor laser shown in FIG. 1 is completed.

The following is the explanation of simulation results of characteristics of the nitride-based semiconductor laser according to this embodiment.

One example of the semiconductor laser simulator used herein is a LASTIP (Laser Technology Integrated Program) commercially available from Crosslight Software Inc., which is a simulator operating on the principles of Maxwell equations, the Poisson equation, rate equations, and the like.

Figure 4:
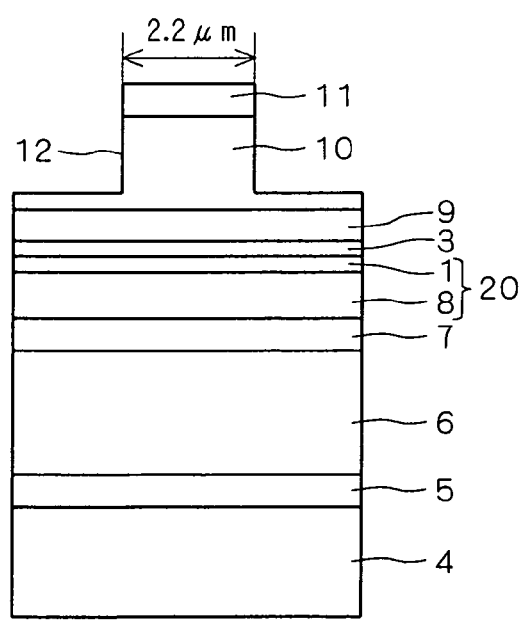
FIG. 4 is a sectional view showing a configuration of a semiconductor light-emitting device used in simulation according to the first embodiment.

FIG. 4 is a sectional view showing a configuration of a nitride-based semiconductor laser used in simulation. As shown in FIG. 4, on the GaN substrate 4, the GaN buffer layer 5, the n-type AlGaN clad layer 6, and the n-type GaN optical guide 7 having a thickness of 100 nm are formed sequentially.

On the n-type GaN optical guide layer 7, the active layer 8 having a multiple quantum well structure, consisting of three well layers 3.5 nm in thickness and barrier layers 7.0 nm in thickness, is formed.

Further, the final barrier layer 1 having a thickness of 20 nm, the p-type AlGaN electron blocking layer 3 having a thickness of 20 nm and an Al composition ratio of 0.20, the p-type GaN optical guide layer 9 having a thickness of 100 nm, the p-type AlGaN clad layer 10 having a thickness of 400 nm, and the p-type GaN contact layer 11 having a thickness of 100 nm are sequentially laminated. The ridge 12 has a width of 2.2 μm.

In the nitride-based semiconductor laser having the aforementioned structure, the performance is simulated with the following conditions: InGaN having an In composition ratio of 0.02 as a material of the final barrier layer 1 and all of the barrier layers 2, using GaN having a larger band gap than that of InGaN having an In composition ratio of 0.02, and using InGaN having an In composition ratio of 0.02 only as the final barrier layer 1, while using GaN as all of barrier layers 2.

Figure 5:
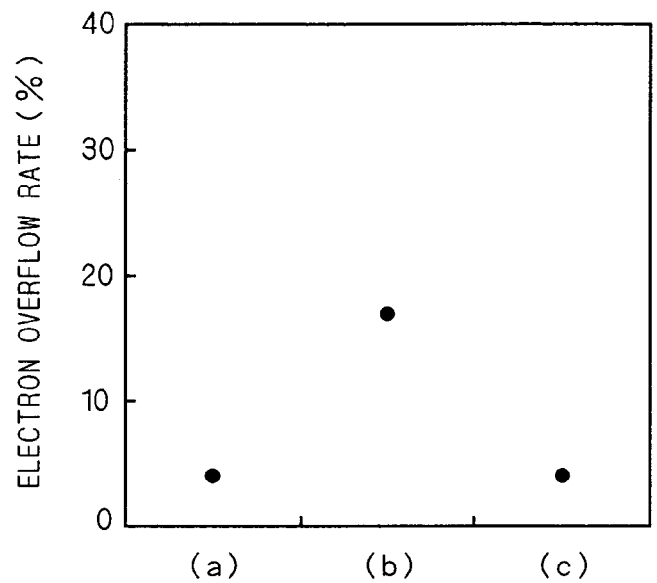
FIG. 5 shows simulation results of an optical output-current characteristic in the nitride-based semiconductor laser according to the first embodiment.
Figure 6:
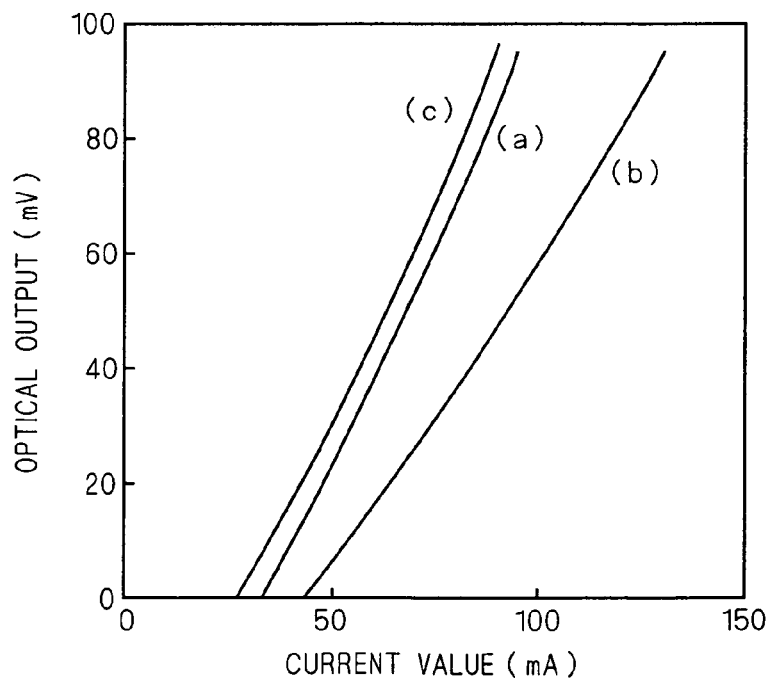
FIG. 6 shows simulation results of an electron overflow rate in a nitride-based semiconductor laser according to the first embodiment.

FIGS. 5 and 6 show calculation results by simulation in the above conditions. FIG. 5 shows the rate of electrons becoming reactive current by overflow of injected electrons from the electron blocking layer 3. FIG. 6 shows optical output-current characteristic.

In FIGS. 5 and 6, "a" shows the case of using InGaN having an In composition ratio of 0.02 as the material of the final barrier layer 1 and of all of the barrier layers 2, "b" shows the case of using GaN as the material of the final barrier layer 1 and of all of the barrier layers 2, and "c" shows the case of using InGaN having an In composition ratio of 0.02 as the material of only the final barrier layer 1 while using GaN as the material of all of the barrier layers 2.

As shown in "b" in FIG. 5, when a material of a wide band gap (GaN) is used in all of the final barrier 1 and barrier layers 2, the rate of overflow of electrons from the electron blocking layer 3 to the p-side is increased. As a result, as shown in "b" in FIG. 6, elevation of threshold current and drop of differential efficiency are observed.

However, as shown in "c" in FIG. 5, when a material having a smaller band gap than that of the barrier layers 2 (InGaN: In composition ratio 0.02) is used for the final barrier layer 1, the rate of overflow of electrons from the electron blocking layer 3 is considerably decreased. As a result, as shown in "c" in FIG. 6, threshold current is decreased, and differential efficiency is increased.

By using GaN having a large band gap for the barrier layers 2, electrons overflowing the barrier layers 2 from the well layer 18 can be decreased, and the differential efficiency is further improved as compared with the case "a".

The simulation result suggests that the rate of overflow of electrons from the electron blocking layer 3 to the p-side is mostly determined by the band discontinuity of the conduction band between the final barrier layer 1 and the electron blocking layer 3. Accordingly, when the band gap of the final barrier layer 1 is further reduced, the rate of overflow of electrons from the electron blocking layer 3 can be further decreased.

As explained herein, in the semiconductor light-emitting device according to this embodiment, the band gap of the final barrier layer 1 is set to be smaller than the band gap of the barrier layers 2.

As compared with the case of using the same material as the barrier layers 2 and the final barrier layer 1, the band discontinuity (electron barrier) of the conduction band between the final barrier layer 1 and the electron blocking layer 3 is larger, and hence electrons overflowing the electron barrier can be suppressed.

In FIGS. 5 and 6, the material of the barrier layers 2 is InGaN or GaN, and the material of the final barrier layer 1 is InGaN. However, regardless of the material of the barrier layers 2, so long as the material of the final barrier layer 1 has a smaller band gap than the band gap of the barrier layers 2, it is possible to lower the overflow rate of electrons from the electron blocking layer 3.

In this embodiment, the layer at the p-side contacting with the final barrier layer 1 is an AlGaN electron blocking layer 3, but the same effects are obtained by using the optical waveguide layer 9 or the p-type clad layer 10 made of AlGaN or GaN having a smaller Al composition ratio.

That is, the same effects are obtained in the nitride-based semiconductor laser in a structure not having the AlGaN electron blocking layer 3 or the optical waveguide layer 9.

The nitride-based semiconductor laser according to first embodiment has the final barrier layer 1 disposed in contact with a well layer 18.

Since the final barrier layer 1 is formed on the well layer 18, deterioration in crystallinity of the well layer 18 can be prevented.

The thickness of the final barrier layer 1 is different from and larger than the thickness of the barrier layers 2 and the well layers 18, so the overflow rate of electrons from the electron blocking layer 3 can be further lowered.

Second Embodiment

A nitride-based semiconductor laser according to a second embodiment is similar to the first embodiment, except that the final barrier layer 1 is formed of a plurality of partial final barrier layers 13, 19 (not shown in FIG. 1).

Herein, the partial final barrier layer 13 is called a first barrier layer disposed closer to the n-type layers of the semiconductor laser, i.e., the n-side, and the partial barrier layer 19 is called a second barrier layer disposed closer to the p-side.

The first barrier layer 13 has a thickness of, for example, 10 nm, is made of InGaN having an In composition ratio of 0.02, and is formed on the active layer 8. On the first barrier layer 13, the second barrier layer 19 having a thickness of 10 nm and made of InGaN having an In composition ratio of 0.04 is formed.

Other configuration is the same as in the nitride-based semiconductor laser according to the first embodiment, and duplicate explanation is omitted.

FIG. 7 is a band diagram in the vicinity of the structure 20 of the nitride-based semiconductor laser according to this embodiment. The band diagram in FIG. 7 indicates same reference numerals as the structure, at the position corresponding to the configuration of nitride-based semiconductor laser of the first embodiment.

As shown in FIG. 7, the invention according to this embodiment is increased in the band discontinuity in the conduction band between the second barrier layer 19 and the electron blocking layer 3.

That is, by making the band gap of the second barrier layer 19 smaller than the band gap of the barrier layer 2, the band discontinuity in the conduction band between the second barrier layer 19 and the electron blocking layer 3 is increased.

The rate of electrons overflowing from electron blocking layer 3 to the p-side is mostly determined by the band discontinuity in the conduction band between the second barrier layer 19 and the electron blocking layer 3.

Accordingly, as in the first embodiment, if a material having a large band gap is used for the barrier layers 2, electrons overflowing the electron blocking layer 3 can be suppressed.

In the semiconductor light-emitting device according to the second embodiment, the band gap of the second barrier layer 19 is smaller than the band gap of the first barrier layer 13 that is adjacent to the second barrier layer 19.

Accordingly, the band discontinuity in the conduction band between the second barrier layer 19 and the electron blocking layer 3 can be increased as compared with placing the first barrier layer 13 that is adjacent the electron blocking layer 3.

As a result, electrons overflowing the electron blocking layer 3 can be suppressed.

In the semiconductor light-emitting device according to the second embodiment, the material of the second barrier layer 19 is InGaN, and the material of the first barrier layer 13 adjacent to the second barrier layer 19 is InGaN or GaN having a band gap larger than the band gap of the second barrier layer 19.

Accordingly, the band discontinuity in the conduction band between the partial final barrier layer 19 and the electron blocking layer 3 can be increased as compared with the case of bonding the first barrier layer 13 to the electron blocking layer 3.

As a result, electrons overflowing the electron blocking layer 3 can be suppressed.

The band gap of the first barrier layer 13 may be the same or almost same as the band gap of the barrier layers 2.

When the band gap of the first barrier layer 13 is the same or almost same as the band gap of the barrier layers 2, band shapes are almost the same in all of the well layers 18, and quantum levels formed in the well layers 18 may be almost the same. As a result, the threshold current is decreased and differential efficiency is enhanced.

Third Embodiment

In a nitride-based semiconductor laser according to a third embodiment, the final barrier layer 1 is made of InGaN of which In composition ratio increases continuously from 0.02 to 0.04 in the direction from the closest well layer 18 to the electron blocking layer 3.

Other configuration is the same as in the nitride-based semiconductor laser according to the first embodiment, and duplicate explanation is omitted.

Figure 8:
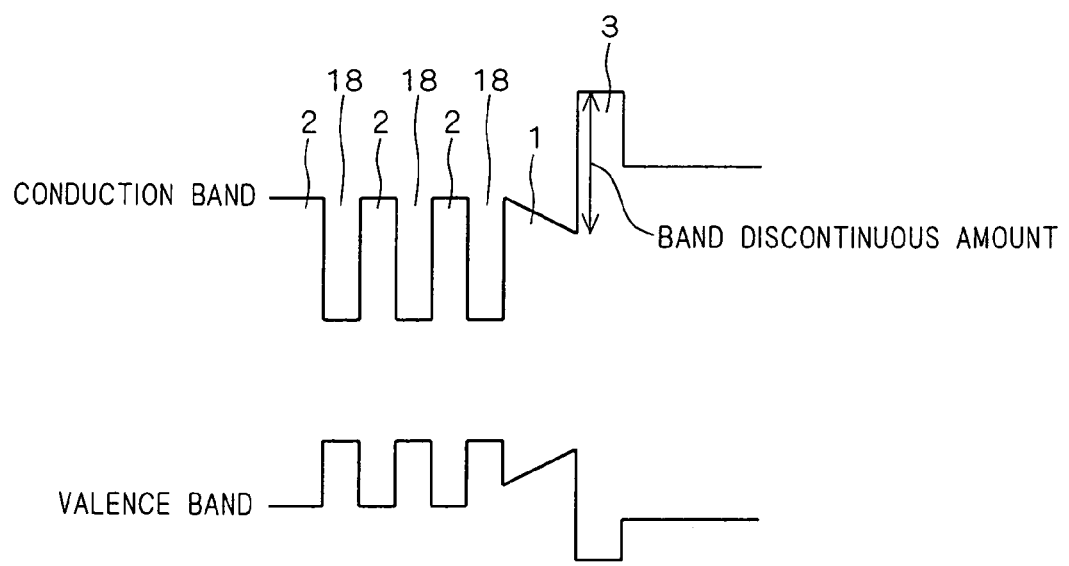
FIG. 8 is a band diagram of a nitride-based semiconductor laser according to a third embodiment.

FIG. 8 is a band diagram in the vicinity of the structure 20 of the nitride-based semiconductor laser according to this embodiment. As shown in FIG. 8, the band gap of the final barrier layer 1 decreases continuously approaching the electron blocking layer 3, and at the position contacting the electron blocking layer 3, the band gap is smaller than the band gap of the barrier layers 2.

The rate of electrons overflowing from electron blocking layer 3 is mostly determined by the band discontinuity in the conduction band at the contacting position of the final barrier layer 1 and the electron blocking layer 3, and, therefore, in this embodiment, the same effects as in the first embodiment can be obtained.

The material of the final barrier layer 1 is not limited to InGaN, but any material may be used so long as the band gap is smaller than the band gap of the barrier layers 2 at the position contacting the electron blocking layer 3.

Fourth Embodiment

In a fourth embodiment, barrier layers 2 are made of $In_xAl_yGa_{1-x-y}N$ ($0 \leq x < 1$, $0 \leq y \leq 1$, $x+y \leq 1$). Other configuration is the same as in the first to third embodiments, and duplicate explanation is omitted.

By using $In_xAl_yGa_{1-x-y}N$ in the barrier layers 2, the band gap of the barrier layers 2 is set larger than the case where InGaN is used. As a result, overflow of electrons from a well layer 18 can be further suppressed. Hence, as compared with the first to third embodiments, a nitride-based semiconductor light-emitting device of further excellent differential characteristic can be obtained.

Fifth Embodiment

A nitride-based semiconductor laser according to a fifth embodiment is similar to the nitride-based semiconductor lasers according to the first to third embodiments, except that the barrier layers 2 are made of GaN.

By using GaN in the barrier layers 2, the band gap of the barrier layers 2 is larger than when InGaN is used, and barrier layers of excellent crystalline quality can be obtained. Hence, a nitride-based semiconductor laser having excellent differential characteristic can be obtained.

While the invention has been shown and described in detail, the foregoing description is in all aspects illustrative and not restrictive. It is therefore understood that numerous modifications and variations can be devised without departing from the scope of the invention.

The invention claimed is:

1. A semiconductor light-emitting device comprising:
    an n-type cladding layer and a p-type cladding layer of a nitride-based III-V compound semiconductor material;
    an active layer, sandwiched by said n-type and p-type cladding layers, of a nitride-based III-V compound semiconductor material, wherein
        said active layer includes a plurality of barrier layers, and a plurality of well layers, said well and barrier layers being alternatingly arranged,
        all of said well layers of said active layer have a first bandgap energy that is substantially uniform,
        all of said barrier layers of said active layer have a second bandgap energy that is substantially uniform, and
        said active layer has a first end closer to said n-type cladding layer than to said p-type cladding layer, located adjacent one of said barrier layers, and a second end, closer to said p-type cladding layer than to said n-type cladding layer, and located adjacent one of said well layers;
    a final barrier layer of a nitride-based III-V compound semiconductor material, which, with said active layer, constitutes a multiple quantum well structure, and which is located between the second end of said active layer and said p-type cladding layer, said final barrier layer including at least one layer having a band gap energy that is smaller than the second band gap energy; and
    an electron blocking layer of a nitride-based III-V compound semiconductor material including Al and which is located between said final barrier layer and said p-type cladding layer, and which contacts said at least one layer of said final barrier layer having a band gap energy that is smaller than the second band gap energy, wherein
        said p-type cladding layer has a bandgap energy larger than the second bandgap energy, and
        said electron blocking layer has a bandgap energy larger than the bandgap energy of said p-type cladding layer.

2. The semiconductor light-emitting device according to claim 1, wherein the band gap energy of said final barrier layer becomes continuously smaller approaching said p-type cladding layer.

3. The semiconductor light-emitting device according to claim 1, wherein said barrier layers are InAlGaN.

4. The semiconductor light-emitting device according to claim 1, wherein said barrier layers are GaN.

5. The semiconductor light-emitting device according to claim 1, wherein said final barrier layer is InGaN, and said barrier layers are GaN.

6. The semiconductor light-emitting device according to claim 1, wherein
    said final barrier layer includes first and second layers, and,
    said second layer of said final barrier layer is closer to said p-type cladding layer than is said first layer, and said second layer has the band gap energy that is smaller than the second band gap energy.

7. The semiconductor light-emitting device according to claim 6, wherein said first layer of said final barrier layer is in contact with the second end of said active layer and has the second band gap energy.

8. The semiconductor light-emitting device according to claim 1, wherein
    said final barrier layer includes first and second layers, and
    said second layer of said final barrier layer is closer to said p-type cladding layer than is said first layer, and said second layer has a band gap energy that is smaller than the band gap energy of said first layer of said final barrier layer.

9. The semiconductor light-emitting device according to claim 8, wherein said first layer of said final barrier layer has the second band gap energy.

10. The semiconductor light-emitting device according to claim 8, wherein
    said second layer of said final barrier layer is InGaN, and
    said first layer of said final barrier layer is InGaN or GaN and has a larger band gap energy than said second layer of said final barrier layer.

11. A semiconductor light-emitting device comprising:
    an n-type cladding layer and a p-type cladding layer of a nitride-based III-V compound semiconductor material;
    an active layer, sandwiched by said n-type and p-type cladding layers, of a nitride-based III-V semiconductor material, wherein said active layer includes a plurality of barrier layers, and a plurality of well layers alternating with said barrier layers, all of said well layers of said active layer have a first bandgap energy that is substantially uniform, all of said barrier layers of said active layer have a second bandgap energy that is substantially uniform, and said active layer has a first end closer to said n-type cladding layer than to said p-type cladding layer, located adjacent one of said barrier layers, and a second end, closer to said p-type cladding layer than to said n-type cladding layer, and located adjacent one of said well layers;

a first layer of a of a nitride-based III-V compound semiconductor material which is located between the second end of said active layer and said p-type cladding layer, and which has a band gap energy smaller than the second band gap energy and larger than the first band gap energy; and an electron blocking layer of a nitride-based III-V compound semiconductor material including Al and which is located between said first layer and said p-type cladding layer, contacting said first layer, wherein said p-type cladding layer has a bandgap energy larger than the second bandgap energy, and said electron blocking layer has a bandgap energy larger than the bandgap energy of said p-type cladding layer.

12. The semiconductor light-emitting device according to claim 11, further comprising an optical waveguide layer having a larger band gap energy than the second band gap energy and disposed in contact with said p-type cladding layer, wherein said first layer is disposed between said active layer and said optical waveguide layer, in contact with said optical waveguide layer.

13. The semiconductor light-emitting device according to claim 11, wherein said electron blocking layer has a larger band gap energy than the second band gap energy, and said first layer is in contact with said electron blocking layer.

14. The semiconductor light-emitting device according to claim 11, wherein said first layer is in contact with the one of said well layers that is located at the second end of said active layer.

15. The semiconductor light-emitting device according to claim 11, wherein said plurality of barrier layers are $In_xAl_yGa_{1-x-y}N$ ($0 \leq x < 1$, $0 \leq y < 1$, $x+y \leq 1$).

16. The semiconductor light-emitting device according to claim 11, further comprising a second layer disposed between said active layer and said first layer, in contact with said first layer, and having a band gap energy different from the band gap energy of said first layer and larger than the first band gap energy.

17. The semiconductor light-emitting device according to claim 16, wherein said second layer has the second band gap energy.

18. The semiconductor light-emitting device according to claim 11, wherein said barrier layers are GaN, and said first layer is InGaN.

19. The semiconductor light-emitting device according to claim 18, wherein said first layer has a thickness different from thicknesses of said plurality of barrier layers and said plurality of well layers.

20. The semiconductor light-emitting device according to claim 18, wherein said first layer is thicker than said plurality of barrier layers.

21. The semiconductor light-emitting device according to claim 13, wherein said barrier layers are $In_xGa_{1-x}N$, said well layers are $In_yGa_{1-y}N$, said first layer is $In_zGa_{1-z}N$, and In composition ratios x, y, and z satisfy $0<x<z<y<1$.

22. The semiconductor light-emitting device according to claim 21, wherein the In composition ratios x, y, and z satisfy $(y-z)>(z-x)$.

23. The semiconductor light-emitting device according to claim 21, wherein said first layer has a thickness different from thicknesses of said plurality of barrier layers and said plurality of well layers.

24. The semiconductor light-emitting device according to claim 21, wherein said first layer is thicker than said plurality of barrier layers.

* * * * *